(12) United States Patent
Pan et al.

(10) Patent No.: US 8,958,246 B2
(45) Date of Patent: Feb. 17, 2015

(54) VERTICALLY FOLDABLE MEMORY ARRAY STRUCTURE

(75) Inventors: Liyang Pan, Beijing (CN); Fang Yuan, Beijing (CN)

(73) Assignee: Tsinghua University, Beijing (CN)

( * ) Notice: Subject to any disclaimer, the term of this patent is extended or adjusted under 35 U.S.C. 154(b) by 256 days.

(21) Appl. No.: 13/520,155

(22) PCT Filed: Jun. 27, 2011

(86) PCT No.: PCT/CN2011/076406
§ 371 (c)(1),
(2), (4) Date: Jun. 29, 2012

(87) PCT Pub. No.: WO2012/103711
PCT Pub. Date: Aug. 9, 2012

(65) Prior Publication Data
US 2013/0069141 A1     Mar. 21, 2013

(30) Foreign Application Priority Data
Jan. 31, 2011     (CN) .......................... 2011 1 0034098

(51) Int. Cl.
*G11C 11/34*     (2006.01)
*H01L 27/088*     (2006.01)
*H01L 29/792*     (2006.01)
(Continued)

(52) U.S. Cl.
CPC ................. *H01L 29/792* (2013.01); *G11C 5/02* (2013.01); *G11C 5/063* (2013.01); *G11C 8/14* (2013.01); *G11C 16/0466* (2013.01); *G11C 16/0483* (2013.01); *H01L 27/0688* (2013.01); *H01L 29/7926* (2013.01); *H01L 27/11582* (2013.01)
USPC ...... 365/185.17; 257/390; 257/397; 257/401; 257/E29.309

(58) Field of Classification Search
CPC .. G11C 16/0466; G11C 16/0483; G11C 5/02; G11C 5/063; G11C 8/14; H01L 27/0688; H01L 27/11582; H01L 29/792; H01L 29/7926
USPC ............. 257/401, 390, 397, 773; 365/185.17
See application file for complete search history.

(56) References Cited

U.S. PATENT DOCUMENTS

8,107,286 B2 *   1/2012   Itagaki et al. ............ 365/185.02
2011/0291176 A1 *  12/2011   Lee et al. ...................... 257/324
(Continued)

*Primary Examiner* — Jose R Diaz
(74) *Attorney, Agent, or Firm* — Houtteman Law LLC (57) ABSTRACT

A vertically foldable memory array structure is provided, comprising: a memory module distributed in columns and rows, comprising: a drain selection transistor; a bottom connecting line and a source selection transistor; and a plurality of memory cell transistors connected between the drain selection transistor and the bottom connecting line and between the source selection transistor and the bottom connecting line, a drain of each drain selection transistor is connected to a bit line, a drain of a drain selection transistor in a $M^{th}$ vertically foldable memory module in a $N^{th}$ column and a source of a source selection transistor in a $(M-1)^{th}$ memory module in a $(N+1)^{th}$ column are connected to a same bit line, gates of the drain selection transistors and the source selection transistors in all the memory modules in the $N^{th}$ column are connected to a same drain selection line and a same source selection line.

13 Claims, 9 Drawing Sheets

(51) Int. Cl.
*G11C 5/02* (2006.01)
*G11C 5/06* (2006.01)
*G11C 8/14* (2006.01)
*G11C 16/04* (2006.01)
*H01L 27/06* (2006.01)
*H01L 27/115* (2006.01)

(56) References Cited

U.S. PATENT DOCUMENTS

2012/0008400 A1* 1/2012 Fukuzumi et al. ....... 365/185.18
2013/0234299 A1* 9/2013 Murakami ................... 257/632

* cited by examiner

Fig. 1

Prior Art

Fig. 2

Prior Art

Fig. 3

Prior Art

VERTICALLY FOLDABLE MEMORY ARRAY STRUCTURE

FIELD

The present disclosure relates to a semiconductor fabrication and design, and more particularly to a vertically foldable memory array structure.

BACKGROUND

A flash memory may not lose stored data even after powered down, so it is especially adapted to a field of storage components in mobile communications, computer, etc. Some flash memories also have a high-density memory capacity and may be used in large-capacity removable memory media and other applications. A SONOS flash memory has a silicon-oxide-nitride-oxide-silicon structure and comprises a tunneling oxide layer, a silicon nitride layer and a blocking oxide layer. In the SONOS flash memory, a charge (an electron or a hole) is injected into a silicon nitride layer through a tunneling oxide layer by using a quantum tunneling or hot carrier injection effect, and trapped by charge traps in the silicon nitride layer, thus changing a threshold voltage of a device cell and achieving data storage.

Figure 1:
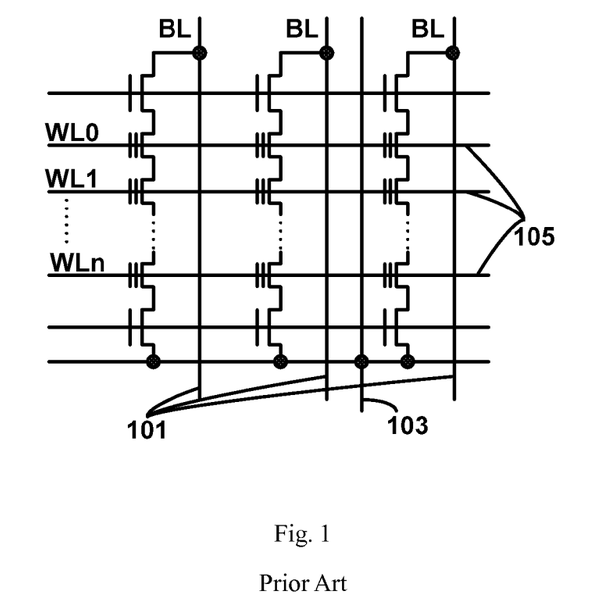
FIG. 1 is a schematic view of a conventional SONOS flash memory array based on a NAND serial structure.

FIG. 1 is a schematic view of a conventional SONOS flash memory array based on a NAND serial structure. A series of SONOS memory modules are connected together, and SONOS memory cell transistors are connected to a plurality of bit lines 101 via a drain selection transistor (DST) respectively. A source of the memory cell transistor is connected to a common source line (SL) 103 via a source selection transistor (SST). Gates of the memory cell transistors are connected together via a series of polysilicon routings to form a word line (WL) 105. The NAND structure memory has a high-capacity memory feature of a NAND structure, and performs programming and erasing operations by using a FN tunneling mechanism. However, as a requirement for large capacity and high density of a memory increases daily, a conventional planar NAND array flash memory may not be endlessly scaled down because of a limit of the device dimension. Therefore, a capacity and a density of the planar memory may not be further improved, so a three-dimensional memory conception is proposed.

Figure 2:
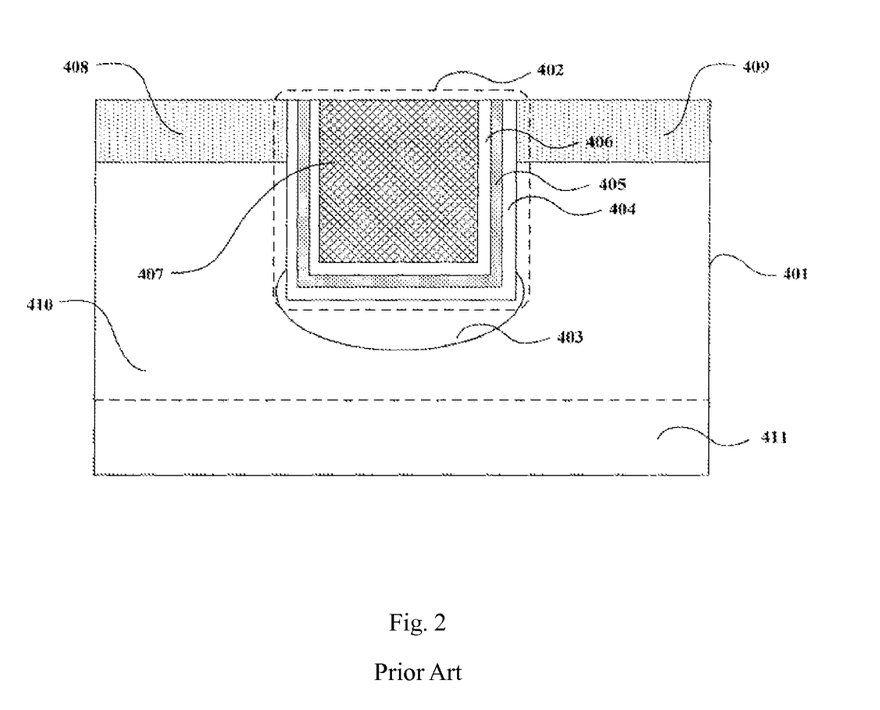
FIG. 2 is a sectional view of a conventional vertical-trench type SONOS memory cell.

FIG. 2 is a sectional view of a conventional vertical-trench type SONOS memory cell. For example, a SONOS memory cell described in Patent Application No. 200410009676.3 comprises a p-type substrate, a p-type well, a deep trench, a n-type doping region on bottom of the deep trench, and a drain region and a source region on each side of the deep trench. Inside the deep trench there is a gate structure consisting of a silicon dioxide tunneling dielectric layer, a charge trapping layer, an insulating dielectric layer and a polysilicon control gate. During a programming operation, if the drain region is to be programmed, a positive voltage is applied to the drain region, the source region is floated or grounded, and a negative voltage is applied to the polysilicon control gate. And if the source region is to be programmed, a positive voltage is applied to the source region, the drain region is floated or grounded, and a negative voltage is applied to the polysilicon control gate. During an erasing operation, a positive voltage is applied to the polysilicon control gate, and the source region and the drain area are floated or grounded. During a reading operation, if an information on the source region is to be read, a positive voltage is applied to the drain region, the source region is grounded, and a positive or negative voltage is applied to the control gate. And if an information on the drain region is to be read, a positive voltage is applied to the source region, the drain region is grounded, and a positive or negative voltage is applied to the polysilicon control gate. The structure performs a programming operation according to a band-to-band tunneling hot hole injection principle, and performs an erasing operation by channel F-N erasing. The structure with a vertical channel is conducive to a three-dimensional integration.

Figure 3:
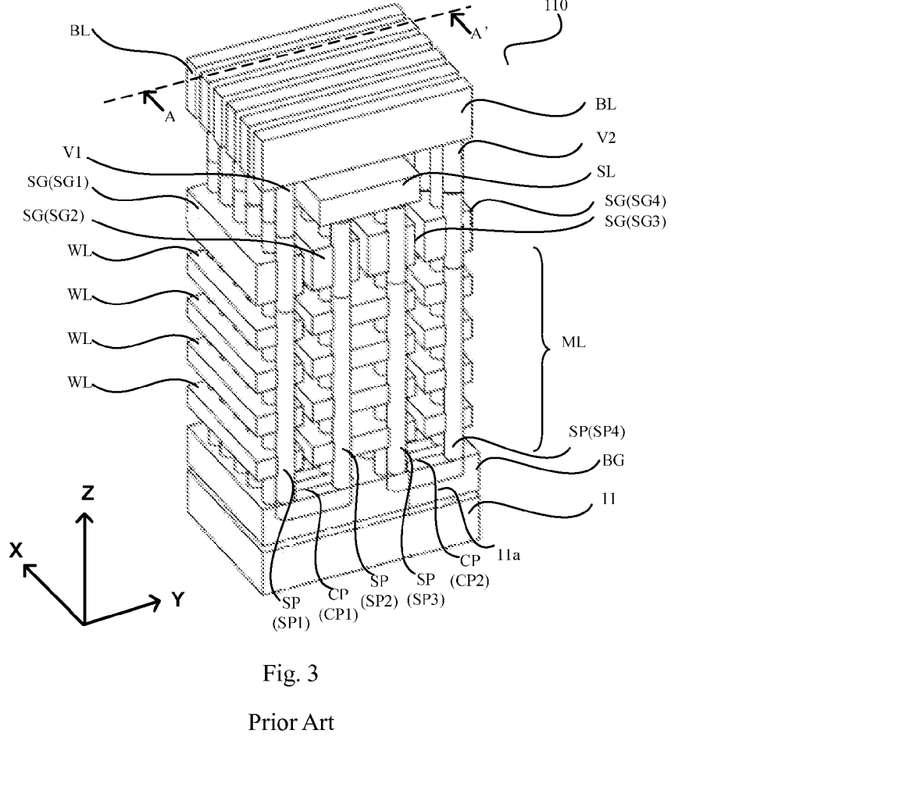
FIG. 3 is a perspective view of a conventional vertical series SONOS flash memory structure.

Based on a concept of a vertical channel memory cell transistor, a vertical series SONOS flash memory array structure is proposed in US 20100200906 by M. Kidoh et al. in 2010. FIG. 3 is a perspective view of a conventional vertical series SONOS flash memory structure. Two adjacent NAND memory modules are connected via a bottom CP to form a "U-shaped pipe", in which CP is a transistor controlled by a bottom gate electrode. One end of the "U" shaped string is connected to a bit line BL, and the other end thereof is connected to a source line SL. BL and SL are formed by different layers of metal routings. Both a selection gate and a control gate of a transistor are located below the BL and SL. The control gates (WL) are spaced apart from each other by a slit, and have a comb-like shape. A memory dielectric comprises a blocking oxide layer, a charge trapping layer and a tunneling oxide layer. By applying different combinations of voltages to the bit line, the word line and the source line, a programming, erasing or reading operation for one or more memory cell transistors in the array may be achieved.

The shortcomings of the prior art are that the vertical series SONOS flash memory process and control method in FIG. 3 are complex, which urgently needs to be improved.

SUMMARY

The present disclosure is aimed to solve at least one of the above mentioned technical problems, and a vertically foldable memory array structure is provided.

According to an aspect of the present disclosure, a vertically foldable memory array structure is provided, comprising: a memory module distributed in columns and rows, the memory module comprising: a drain selection transistor; a bottom connecting line and a source selection transistor; and a plurality of memory cell transistors connected between the drain selection transistor and the bottom connecting line and between the source selection transistor and the bottom connecting line, wherein a gate of each of the plurality of memory cell transistors is connected to a word line, a drain of each drain selection transistor is connected to a bit line, a drain of a drain selection transistor in a $M^{th}$ vertically foldable memory module in a $N^{th}$ column and a source of a source selection transistor in a $(M-1)^{th}$ memory module in a $(N+1)^{th}$ column are connected to a same bit line, gates of the drain selection transistors and the source selection transistors in all the memory modules in the $N^{th}$ column are connected to a same drain selection line and a same source selection line respectively, in which N and M are an integer.

In one embodiment, the memory cell transistor comprises: a tubular polysilicon body filled with an insulating dielectric; and a tubular gate structure surrounding the tubular polysilicon body.

In one embodiment, the tubular gate structure comprises a tubular tunneling oxide layer, a tubular silicon nitride layer, a tubular blocking oxide layer and a tubular gate layer sequentially surrounding the tubular polysilicon body.

In one embodiment, the memory cell transistor is a charge trapping type memory or a nano-crystal memory.

In one embodiment, if a programming voltage is applied to a word line of a selected memory cell transistor, a memory cell transistor between the selected memory cell transistor and the drain selection transistor is turned on, a memory cell transistor between the selected memory cell transistor and the source selection transistor is turned off, a programming voltage is applied to a bit line connected to a drain selection transistor which the selected memory cell transistor connects to, and a grounding voltage is applied to other bit lines, then a programming write operation is performed for the selected memory cell transistor.

In one embodiment, if an erasing voltage is applied to a word line of one or more selected memory cell transistors, a grounding voltage is applied to a drain selection line of a drain selection transistor and a source selection line of a source selection transistor connected to the one or more selected memory cell transistors, and a grounding voltage is applied to all the bit lines, an erasing operation is performed for the one or more selected memory cell transistors.

In one embodiment, if a reading voltage is applied to a word line of a selected memory cell transistor, a reading passing voltage is applied to a drain selection line of a drain selection transistor and a source selection line of a source selection transistor connected to the selected memory cell transistor as well as an unselected word line, a reading voltage and a grounding voltage are applied to bit lines connected to a drain of the drain selection transistor and a source of the source selection transistor respectively, and other unselected bit lines are floated, a reading operation is performed for the selected memory cell transistor.

In one embodiment, a tubular channel region in the memory cell transistor is a polysilicon or germanium doped silicon semiconductor region.

According to another aspect of the present disclosure, a vertically foldable memory array structure is provided, comprising: a memory cell transistor set distributed in columns and rows and comprising a plurality of memory cell transistors, in which a gate of each memory cell transistor is connected to a word line; a plurality of drain selection transistors and a plurality of source selection transistors, in which each of the memory cell transistor sets in a $N^{th}$ column is connected to one drain selection transistor, and each of the memory cell transistor sets in a $(N+1)^{th}$ column is connected to one source selection transistor; and a plurality of bottom connecting lines connected between a memory cell transistor set in a $M^{th}$ row and in the $N^{th}$ column and a memory cell transistor set in a $(M+1)^{th}$ row and in the $(N+1)^{th}$ column, in which a drain of a drain selection transistor and a source of a source selection transistor corresponding to the memory cell transistor set in each row are connected to a same bit line, in which N and M are an integer.

In one embodiment, the memory cell transistor comprises: a tubular polysilicon body filled with an insulating dielectric; and a tubular gate structure surrounding the tubular polysilicon body.

In one embodiment, the tubular gate structure comprises a tubular tunneling oxide layer, a tubular silicon nitride layer, a tubular blocking oxide layer and the tubular gate layer sequentially surrounding the tubular polysilicon body.

In one embodiment, the memory cell transistor is a charge trapping type memory or a nano-crystal memory.

In one embodiment, a tubular channel region in the memory cell transistor is a polysilicon or germanide doped silicon semiconductor region.

According to an embodiment of the present disclosure, the vertically foldable memory array structure not only has a simple structure, but also may be very suitable for a three-dimensional integration of the memory, thus greatly improving a high-density and large-capacity merit of the vertically foldable memory array structure. In addition, according to an embodiment of the present disclosure, a programming operation, an erasing operation and a reading operation are simple and flexible. Meanwhile, according to an embodiment of the present disclosure, a bit line is multiplexed to replace a source selection line (SL) in a conventional NAND memory, thus further simplifying a manufacturing process, saving a space, and further improving a memory efficiency and a capacity. Furthermore, in some embodiments of the present disclosure, all the transistors are vertical transistors with a longitudinal channel, thus causing a scaling down of a device to be more feasible, and meeting a requirement for further scaling down of a memory in future.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF EMBODIMENTS OF THE DISCLOSURE

Embodiments of the present disclosure will be described in detail in the following descriptions, examples of which are shown in the accompanying drawings, in which a same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

In some embodiments of the present disclosure, to describe clearly and simply, a three-dimensional XYZ orthogonal Cartesian coordinate system is introduced. The coordinate system is defined as follows: a first direction vertical to a substrate plane is a Z axis direction (i.e., a first direction), a second direction parallel to the substrate plane is an X axis direction (i.e., a second direction), and a third direction parallel to the substrate plane is a Y axis direction (i.e., a third direction).

Embodiment 1

In some embodiments of the present disclosure, the vertically foldable memory array structure comprises: a memory module distributed in columns and rows, the memory module comprising: a drain selection transistor; a bottom connecting line and a source selection transistor; and a plurality of memory cell transistors connected between the drain selection transistor and the bottom connecting line and between the source selection transistor and the bottom connecting line, in which a gate in each of the plurality of memory cell transistors is connected to a word line, a drain of each drain selection transistor is connected to a bit line, a drain of a drain selection transistor in a $M^{th}$ vertically foldable memory module in a $N^{th}$ column and a source of a source selection transistor in a $(M-1)^{th}$ memory module in a $(N+1)^{th}$ column are connected to a same bit line, gates of the drain selection transistors and the source selection transistors in all the memory modules in the $N^{th}$ column are connected to a same drain selection line and a same source selection line respectively, in which N and M are an integer.

In the above described three-dimensional XYZ orthogonal Cartesian coordinate system, in a YZ plane vertical to the substrate, there are a plurality of "U" shaped memory modules STxy vertical to the substrate and arranged repeatedly in two dimensions, in which a subscript x represents a coordinate of the memory module (i.e., a memory cell transistor string) in the X direction, and a subscript y represents a coordinate of the memory module in the Y direction. Each memory module STxy comprises the following devices connected sequentially in series: one drain selection transistor (DST), z memory cell transistors, one bottom connecting line at a folding part, z SONOS memory cell transistors and one source selection transistor (SST), in which z is not limited to 4 and may be 2-16.

The drain selection transistor and the source selection transistor are a metal-oxide-semiconductor field-effect transistor (MOSFET) respectively. In one embodiment, the plurality of series memory cell transistors are 2 to 16 pairs of silicon-oxide-nitride-oxide-silicon (SONOS) type memory cells, and comprise a tubular polysilicon body being vertical to the substrate and filled with an insulating dielectric, and a gate structure surrounding the tubular polysilicon body which is formed by sequentially arranging a tubular tunneling oxide layer, a tubular silicon nitride layer, a tubular blocking oxide layer and a polysilicon control gate layer. In other embodiments, the memory cell transistor may also be other charge trapping type memories having an operation mechanism similar to that of the SONOS memory. In the charge trapping type memory, high-κ materials such as charge trap-rich $HfO_2$ replace silicon nitride in the SONOS memory as a charge trapping layer. In another embodiment, the memory cell transistor may also be a nano-crystal memory, in which nano-crystal materials having quantum dots replace silicon nitride in the SONOS memory as a charge memory medium.

The drain selection transistor and z memory cell transistors adjacent in series to the drain selection transistor form a branch (STxya) of the memory module. The source selection transistor and z memory cell transistors adjacent in series to the source selection transistor form the other branch (STxyb) of the memory module. And the two branches are connected at the bottom connecting line (i.e., a bottom heavily doped region) to form a "U"-shape vertically foldable memory structure. The oxide layer and the channel region (O—S) of the drain selection transistor and the source selection transistor, and the O—N—O—S region of the SONOS memory transistors have a multilayer tubular structure, and the tubular structures of the memory modules STxya and STxyb punch through corresponding gates (WL) in the Z direction. In the Z direction, a plurality of planar gates are stacked parallelly. A gate plane of the memory cell transistor in the vertically series foldable structure is a word line (WL), and a gate plane of the source selection transistor is a source selection line (SSL), and a gate plane of the drain selection transistor is a drain selection line (DSL). A vertical tubular structure of one branch of the memory module with the same subscript such as STx1a or STx5b punch through the same set of gates, i.e., WL01-WL(z−1)1 and DSL1, or WLz5-WL(2z−1)5 and SSL5. The gates are isolated with an insulating dielectric. Bit lines (BL) are distributed on top of all the memory array structures, and connected to corresponding tubular structures or source/drain in transistors.

Figure 4:
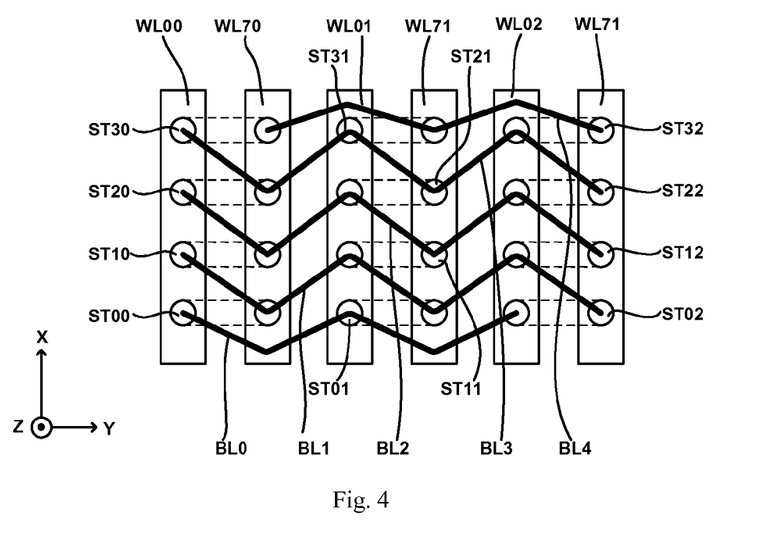
FIG. 4 is a top view of a vertically foldable memory array structure according to a first embodiment of the present disclosure.

FIG. 4 is a top view of a vertically foldable memory array structure according to a first embodiment of the present disclosure. In FIG. 4, a routing diagram of the bit lines (BL) on the top of the vertically foldable memory structure is shown.

In the top of the whole memory array is a bit line (BL) layer parallel to the substrate, and a connection mode of the bit line (BL) layer is as follows (to illustrate conveniently, in the following, taking a 4×3×4 memory array as an example, however, the present disclosure is not limited to this array): a drain of each drain selection transistor and a source of a source selection transistor in an adjacent front row are connected to the same bit line (BL). For example, in FIG. 4, a drain of the drain selection transistor in a memory module ST10 is connected to a source of the source selection transistor in a memory module ST00. In some embodiments, a source of each source selection transistor and a drain of a drain selection transistor in the adjacent back row are connected to the same bit line (BL). For example, in FIG. 4, a source of the source selection transistor in a memory module ST21 is connected to drains of drain selection transistors in memory modules ST31 and ST32. In some embodiments, disconnected regions are isolated with an insulating dielectric.

While operating the memory array, the bit line connection method described above may achieve a multiplexing of bit lines, which differs from a conventional NAND memory structure in which both a bit line and a source line (SL) are needed to execute operations, thus reducing a space occupied by a routing, improving a density of the memory cell transistor and further reducing a process size.

Figure 5:
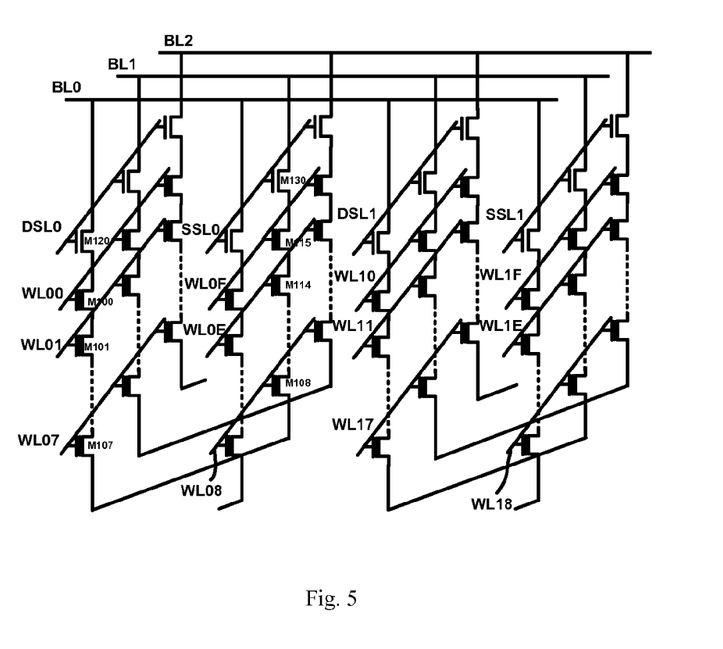
FIG. 5 is an equivalent circuit diagram of the vertically foldable memory array structure according to the first embodiment of the present disclosure.

FIG. 5 is an equivalent circuit diagram of the vertically foldable memory array structure according to the first embodiment of the present disclosure. In FIG. 5, each vertically foldable memory array structure comprising 16 memory cell transistors, three bit lines and two sets of word lines is taken as an example, however, the present disclosure is not limited to this. As shown in FIG. 5, for a memory module consisting of a drain selection transistor 120, memory cell transistors 100-115 and a source selection transistor 130, a drain of the drain selection transistor 120 is connected to a bit line BL0, a source of the source selection transistor 130 is connected to a bit line BL1, and a drain selection line DSL and a source selection line SSL are connected to a gate of the drain selection transistor 120 and a gate of the source selection transistor 130 respectively.

Figure 6:
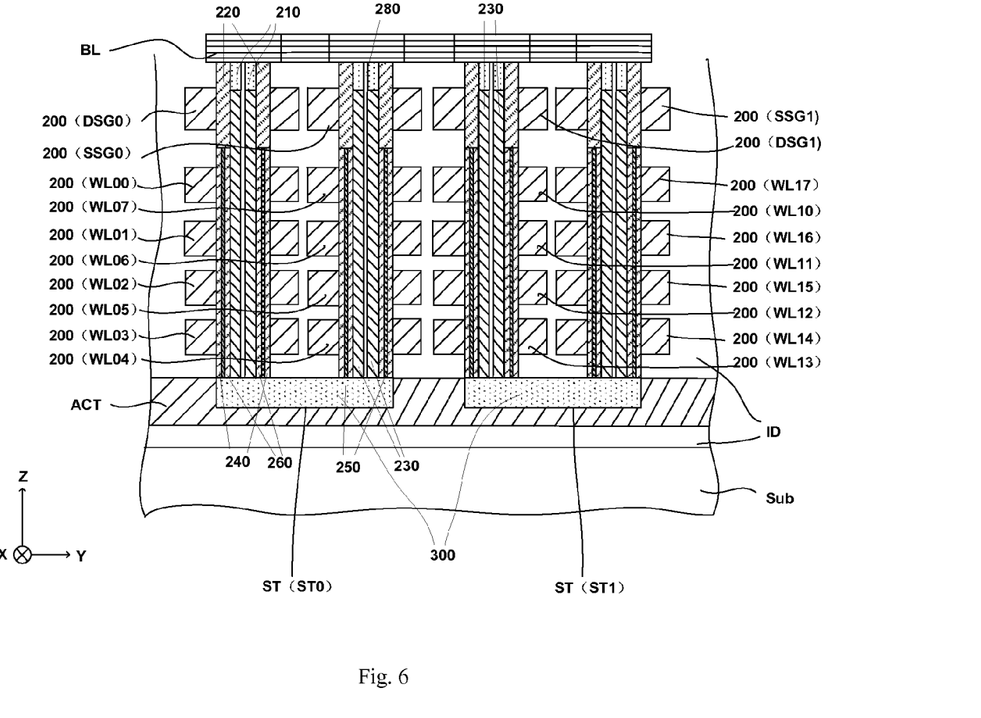
FIG. 6 is a sectional view of the vertically foldable memory array structure according to the first embodiment of the present disclosure.

FIG. 6 is a sectional view of the vertically foldable memory array structure according to the first embodiment of the present disclosure. FIG. 6 is a sectional view of the memory array structure observed along a positive direction of the X axis. Each of the drain selection transistor and the source selection transistor is a metal-oxide-semiconductor field-effect transistor (MOSFET) with a vertical channel, and comprises a polysilicon control gate 200 parallel to the substrate; a concentric tubular structure comprising a gate oxide layer 220 and a polysilicon channel layer 230 sequentially surrounding from outside to inside in an inner side of the gate; and a heavily doped drain or source region 210 located on an upper side of the gate structure. A plurality of memory cell transistors series, which are connected into a "U" shape, are a silicon-oxide-nitride-oxide-silicon (SONOS) type memory with a vertical channel. Each memory cell transistor comprises a polysilicon control gate 200 parallel to the substrate; a concentric tubular structure comprising a blocking oxide layer 240, a silicon nitride layer 250, a tunneling oxide layer 260 and a polysilicon channel layer 230 sequentially surrounding from outside to inside in an inner side of the gate; and an insulating dielectric 280 filled in a center of the tubular structure. A bottom connecting line 300 is a heavily doped region, usually a n-type doped region, in an active region (ACT) in the substrate and connects two branches of memory cell transistor strings. When the substrate is used as a horizontal plane (i.e., an XY plane), the drain selection transistors, the source selection transistors and the memory cell transistors are connected in series with longitudinal channels, and all of them are annular structures. A gate of each memory cell transistor is connected to a word line WL, and a drain of the drain selection transistor and a source of the source selection transistor are connected to each bit line (BL) in a manner as shown in FIG. 4. Gates and tubular structures in different memory cell transistors are isolated with an insulating dielectric (ID). In other embodiments, the memory cell transistor may also be other charge trapping type memories having an operation mechanism similar to that of the SONOS memory. In the charge trapping type memory, high-κ materials such as charge trap-rich $HfO_2$ replace silicon nitride in the SONOS memory as a charge trapping layer. In another embodiment, the memory cell transistor may also be a nano-crystal memory, in which nano-crystal materials having quantum dots replace silicon nitride in the SONOS memory as a charge memory medium.

Figure 7A:
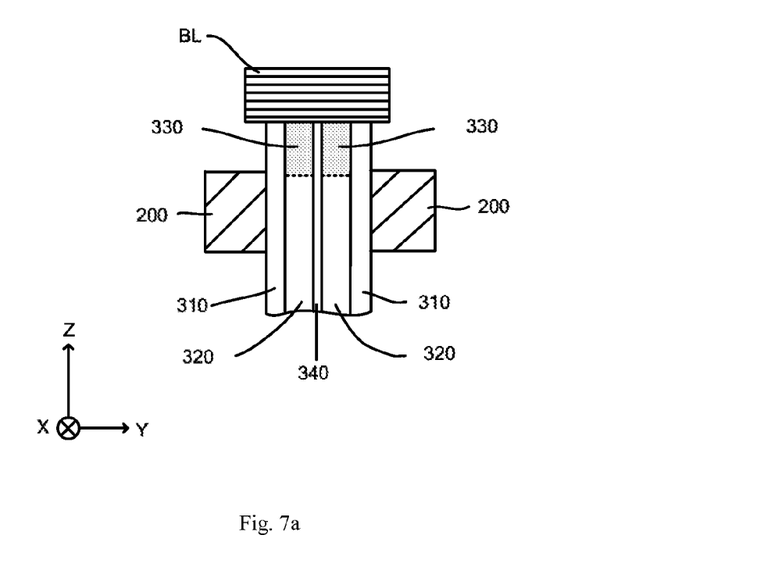
FIG. 7a is a sectional view of a source/drain selection transistor according to the first embodiment of the present disclosure.

FIG. 7a is a sectional view of a source/drain selection transistor according to the first embodiment of the present disclosure. The source/drain selection transistor is located in a the top of the memory array and on a top of the vertically foldable memory module respectively. The source/drain selection transistor is a metal-oxide-semiconductor field-effect transistor (MOSFET) with a vertical channel, and comprises a polysilicon control gate DSG/SSG 200 parallel to the substrate; a concentric tubular structure comprising a oxide layer 310 and a polysilicon channel layer 320 sequentially surrounding from outside to inside in an inner side of the gate; and a heavily doped drain/source n+ region 330 located on an upper side of the gate structure. An insulating dielectric ID340 is filled inside the polysilicon channel layer 320. A heavily doped drain of a drain selection transistor and a heavily doped source of a source selection transistor are connected to corresponding bit lines BL. The asymmetrical abrupt heavily doped drain (source) transistor is used as a selection transistor, which may achieve: when transmitting current, providing adequate opposite type carriers (i.e., electrons); when erasing selected, applying a selecting voltage to the connected bit lines BL and more effectively collecting holes in the channel region to form a GIDL (gate induced drain leakage) current; and when the connected bit lines are zero biased and a small positive voltage is applied to the channel region, reducing the leakage current.

Figure 7B:
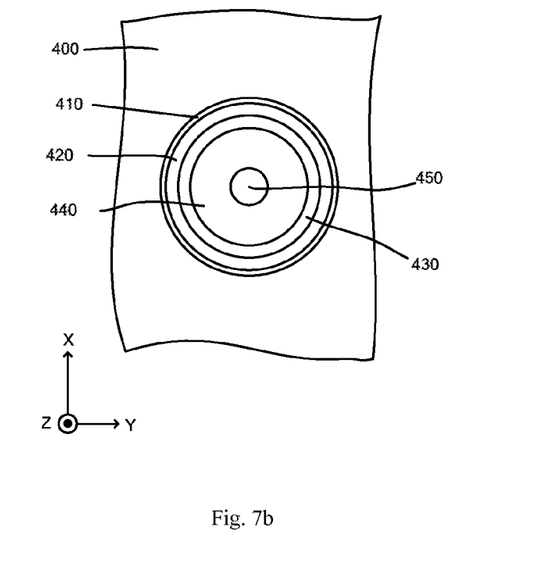
FIG. 7b is a top view of a memory cell transistor according to the first embodiment of the present disclosure.

FIG. 7b is a sectional top view of a memory cell transistor according to the first embodiment of the present disclosure. In this embodiment, the memory cell transistor is a SONOS memory cell transistor. As shown in FIG. 7b, the memory cell transistor comprises a polysilicon gate WL 400 parallel to the substrate; a concentric tubular structure comprising a blocking oxide $SiO_2$ layer 410, a silicon nitride $Si_3N_4$ (or $HfO_2$) layer 420, a tunneling oxide $SiO_2$ layer 430 and a polysilicon channel layer 440 sequentially surrounding from outside to inside in an inner side of the gate; and an insulating dielectric ID 450 filled in a center of the tubular structure. In other embodiments, the memory cell transistor may also be other charge trapping type memories having an operation mechanism similar to that of the SONOS memory. In the charge trapping type memory, high-κ materials such as charge trap-rich $HfO_2$ replace silicon nitride in the SONOS memory as a charge trapping layer. In another embodiment, the memory cell transistor may also be a nano-crystal memory, in which nano-crystal materials having quantum dots replace silicon nitride in the SONOS memory as a charge memory medium.

Figure 8:
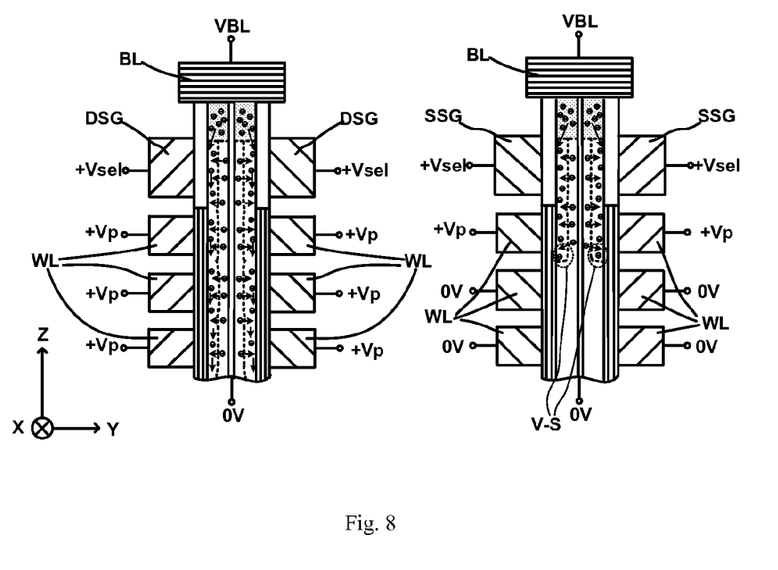
FIG. 8 is a principle scheme of longitudinal current transmission of a selection transistor and a memory cell transistor with a vertical channel according to the first embodiment of the present disclosure.

FIG. 8 is a principle scheme of longitudinal current transmission of a selection transistor and a memory cell transistor with a vertical channel according to the first embodiment of the present disclosure. By turning on or turning off the drain selection transistor and the source selection transistor to select a memory module (i.e., a memory cell transistor string) comprising a memory cell transistor to be operated. A suitable positive voltage+Vsel (i.e., +3V) is applied to a gate of the selection transistor, and then electrons from the heavily doped n-type drain/source region and the p-type body region are attracted by the forward voltage, moving towards an interface between the body region and the gate oxide layer, which gradually forms a conductive channel. By turning on and turning off the memory cell transistor to achieve a conductive transfer function of the memory cell transistor. A positive passing voltage +Vp (i.e., +3V) is applied to a gate of the memory transistor (that is the word line WL), then electrons in the p-type body region are attracted by the forward voltage and move towards an interface between the body region and the gate oxide layer, which gradually forms a conductive channel. When suitable positive voltages are applied to gates of the selection transistors and the memory cell transistors, the formed inversion conductive channels are connected to each other. And the bottom connecting line is n+ doped, which may also provide inversion carriers (i.e., electrons). Therefore a conductive channel from top to bottom is formed at an interface between the body region and the gate dielectric layer of the whole memory cell string, which may be understood that a through n− region is formed. If proper voltages (for example, +4V and 0V respectively) are applied to bit lines (BL) connected at both ends of the channel, electrons in the conductive channel flow in a certain direction because of an electric field between two bit lines to achieve transmission. A left branch of a selected conduction memory module in FIG. 8 (not drawn entirely) shows an example. In contrast, if a selecting voltage is not applied to the gate of the selection transistor, or a passing voltage is not applied to word lines of several memory cell transistors, the inversion conductive channel will not be formed at the interface between the body region and the gate oxide layer, that is, the transfer function may not be achieved. A right branch selected conduction memory module in FIG. 8 shows an example. At this time, an obvious interface between the n-type inversion channel (n− region) and the p-type body region is formed in the body region in a memory cell transistor to which passing voltage is not applied and in a memory cell transistor in which an anti-type channel has been formed, that is, as shown in a dashed line ellipse box, a virtual source region (V-S) in a memory cell transistor having been conducted is formed.

In one embodiment, when a programming voltage is applied to a word line of the selected memory cell transistor, and a memory cell transistor between the selected memory cell transistor and the drain selection transistor is turned on, a memory cell transistor between the selected memory cell transistor and the source selection transistor is turned off, a programming voltage is applied to a bit line connected to a drain selection transistor of the selected memory module, and a grounding voltage is applied to other bit lines, then a programming write operation is performed for the selected memory cell transistor.

Figure 9A:
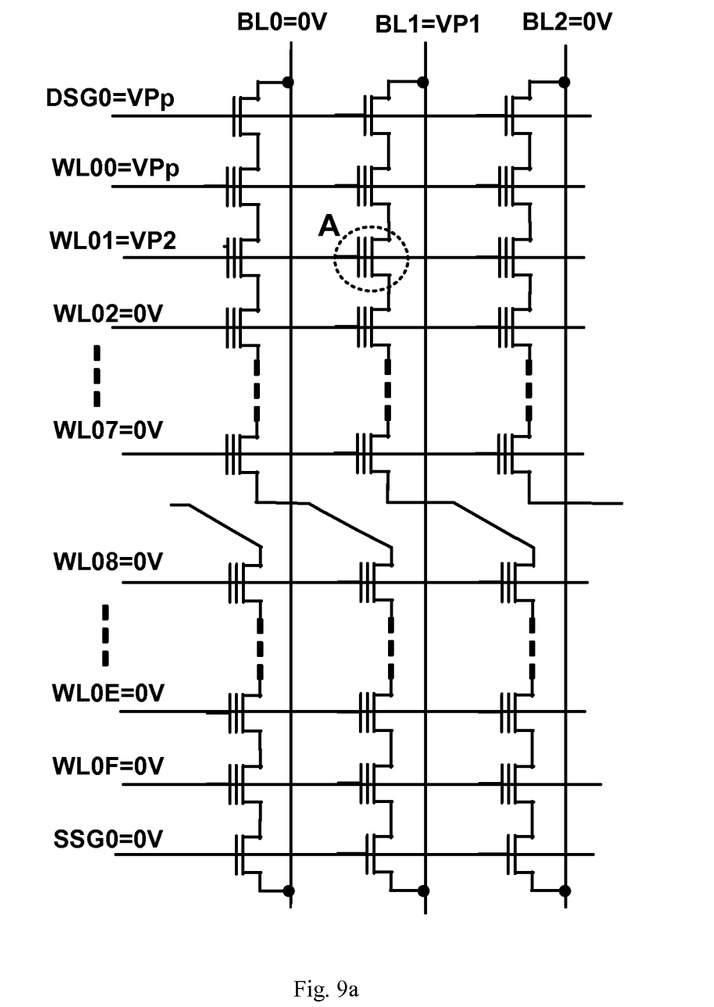
FIG. 9a is a diagram of a voltage applied to different kinds of lines when the vertically foldable memory array structure performs a programming operation according to the first embodiment of the present disclosure.
Figure 9B:
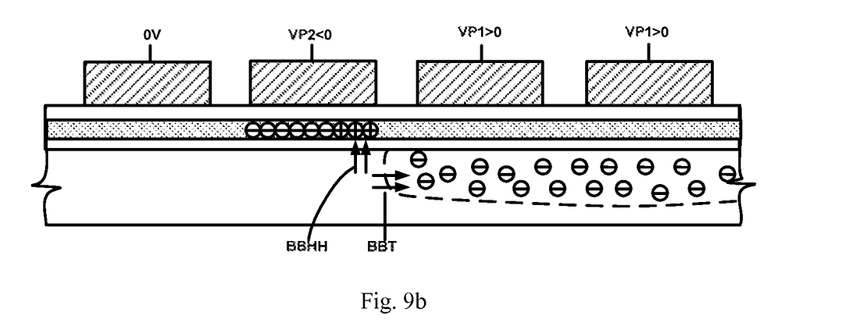
FIG. 9b is a diagram of a programming mechanism of a memory cell transistor array according to an embodiment of the present disclosure.

Particularly, FIG. 9a is a diagram of a voltage applied to different kinds of lines when the vertically foldable memory array structure performs a programming operation according to the first embodiment of the present disclosure. FIG. 9b is a diagram of a programming mechanism of a memory cell transistor array according to an embodiment of the present disclosure. For a SONOS memory cell transistor A to be programmed, a negative programming voltage VP2 (e.g., −5V) is applied to a word line connected to a gate of the SONOS memory cell transistor A, a positive programming voltage VP1 (e.g., 3V) is applied to a bit line connected to a drain of a drain selection transistor in the memory module comprising the memory cell transistor A, and the remaining bit lines are grounded. Meanwhile, for all the memory cell transistors between the memory cell transistor A and the drain selection transistor in the memory module comprising the memory cell transistor A, a programming passing voltage VPp (e.g., 2V) is applied to each word line connected to gates of the all the memory cell transistors, so that the voltage VP1 may be transmitted to a virtual drain of the memory cell transistor A. However, for all the memory cell transistors between adjacent memory cell transistors connected to the memory cell transistor A and a source selection transistor in a cell module, each word line connected to gates of all the memory cell transistors and a bit line connected to a source in a source selection transistor are grounded, to forbid the voltage VP1 being transmitted to other memory cell transistors. Under this connection condition, in the memory module comprising the memory cell transistor A, the voltage VP2 is applied to a gate WL01 of the memory cell transistor A, the voltage VP1 is applied to the virtual source, a band-to-band tunneling (BBT) happens between an non-inverted body region and the virtual drain in the virtual drain of the selected memory cell transistor. Part of electrons in the body region are injected into the n− region by the band-to-band tunneling, while small parts of holes, due to a negative voltage applied to the gate at this time, get large energy to become hot holes and pass through a barrier between the body region and the tunneling oxide layer to inject into a charge trapping layer, which is a band-to-band tunneling hot hole injection (BBHH). The injected hot holes are located in charge trapping centers in the silicon nitride layer near the virtual drain. Holes trapped in the silicon nitride charge trapping centers will neutralize electrons trapped when erasing, thus to reduce a threshold voltage of a partial channel near the virtual source of the memory cell transistor. Therefore, when the memory cell transistor is read, a lower threshold voltage VT2 may be obtained. Since the probability of band-to-band tunneling depends on a control voltage and a bandgap Eg of body materials, a semiconductor with a narrower band gap is more likely to tunnel. The bandgap of Ge is smaller than that of Si (that is, a bandgap of Si is 1.12 eV, a bandgap of Ge is 0.67 eV), so in some embodiments, the body region may be doped with a small amount of Ge to decrease Eg so as to increase the tunneling probability, thereby enhancing the programming efficiency.

In another embodiment, if an erasing voltage is applied to word lines of one or more selected memory cell transistors, a grounding voltage is applied to drain selection lines of drain selection transistors and source selection lines of source selection transistors connected to the one or more selected memory cell transistors, and a grounding voltage is applied to all the bit lines, an erasing operation is performed for the one or more selected memory cell transistors.

Figure 10:
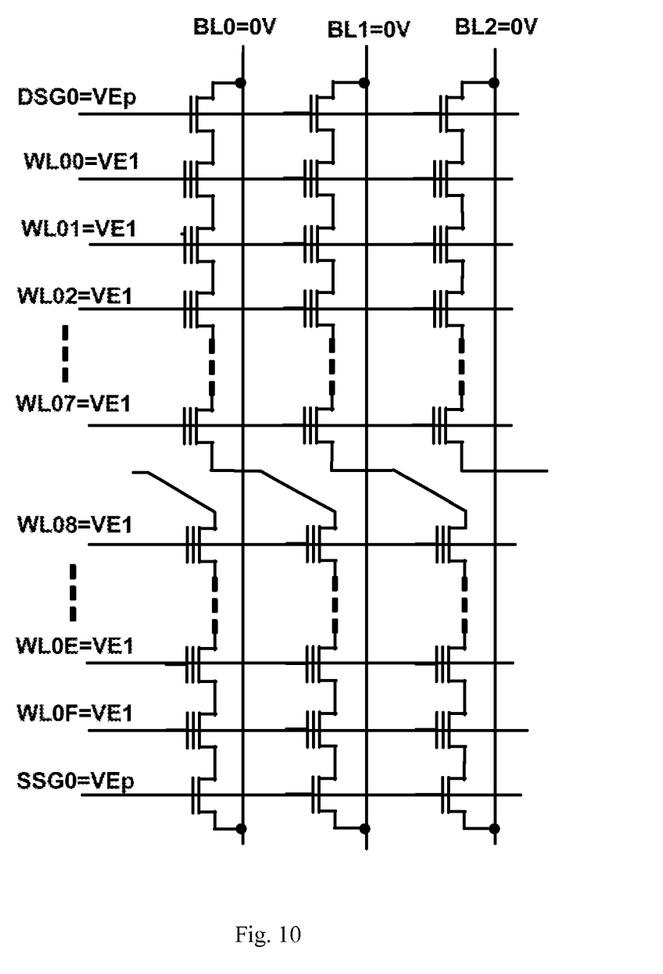
FIG. 10 is a diagram of a voltage applied to different kinds of lines when the vertically foldable memory array structure performs an erasing operation according to the first embodiment of the present disclosure.

Particularly, FIG. 10 is a diagram of a voltage applied to different kinds of lines when the vertically foldable memory array structure performs an erasing operation according to the first embodiment of the present disclosure. In this embodiment, the erasing operation is a block erasing. If n STs (string) are a block of storage region, the selected region may be erased as a whole. For a memory module (i.e., a memory cell string) within a selected block, an erasing voltage VE1 (e.g., 8V) is applied to each word line, an erasing passing voltage VEp (e.g., 5V) is applied to gates of the drain selection transistor and the source selection transistor in these memory modules, and each bit line is grounded. Under the bias condition, electrons will be injected by F—N tunneling into charge trap centers in silicon nitride layers of all the SONOS memory cell transistors in the memory block, so that the threshold voltage of the memory cell transistor may be increased to VT1.

In still another embodiment, if a reading voltage is applied to the word line of the selected memory cell transistor, and a suitable reading passing voltage is applied to a drain selection line of a drain selection transistor and a source selection line of a source selection transistor connected to the selected memory cell transistor as well as to unselected word lines, a reading voltage and a grounding voltage are applied to bit lines connected to a drain of the drain selection transistor and a source of the source selection transistor respectively, and other unselected bit lines are floated, a read operation is performed for the selected memory cell transistor.

Figure 11A:
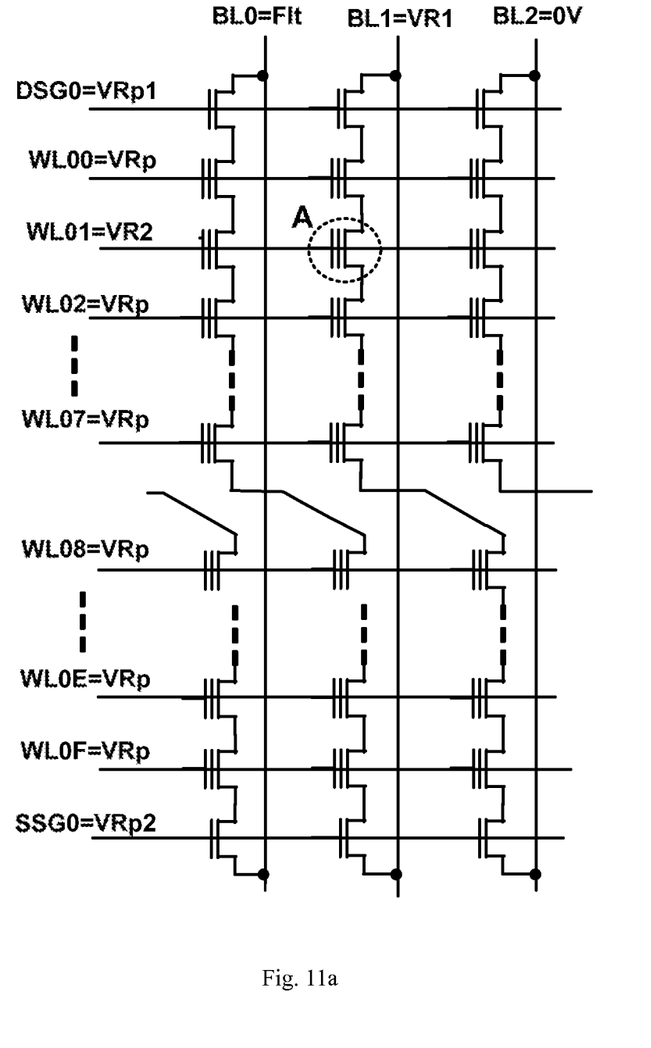
FIG. 11a is a diagram of a voltage applied to different kinds of lines when the vertically foldable memory array structure performs a reading operation according to the first embodiment of the present disclosure.
Figure 11B:
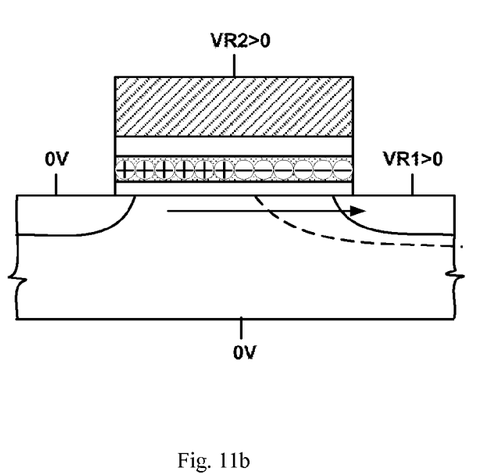
FIG. 11b is a diagram of a reading mechanism of the vertically foldable memory array structure according to the first embodiment of the present disclosure.

Particularly, FIG. 11a is a diagram of a voltage applied to different kinds of lines when the vertically foldable memory array structure performs a reading operation according to the first embodiment of the present disclosure. FIG. 11b is a diagram of a reading mechanism of the vertically foldable memory array structure according to the first embodiment of the present disclosure. For a SONOS memory cell transistor A to be read, a reading voltage VR2 (e.g., 2V) is applied to a word line connected to a gate of the SONOS memory cell transistor A. And a bit line, which is also the bit line of a next adjacent row, connected to a source of a source selection transistor in a memory module comprising the SONOS memory cell transistor A is grounded, and a reading voltage VR1 (e.g., 1V) is applied to a bit line connected to a drain of a drain selection transistor in the memory module comprising the SONOS memory cell transistor A, and the remaining bit lines are floated. Meanwhile, for unselected memory cell transistors and the drain/source selection transistor in the memory module, a reading passing voltage VRp (e.g., 3V) is applied to word lines connected to gates of the unselected memory cell transistors and the drain/source selection transistor, and voltages VRp1 and VRp1 (e.g., 3V and 2V) are applied to gates of the drain selection transistor and the source selection transistor respectively, so that the voltage VR1 may be transmitted to a virtual drain of the memory cell transistor A and a grounding voltage may be transmitted to a virtual source of the memory cell transistor A. Under the applied connection condition, for the memory cell transistor A to be read, the reading voltage VR2 causes a depletion region forming at a virtual drain junction. Due to the depletion region, an impact of trapping electrons which are not neutralized near the virtual drain will be shielded. Therefore, under a control of injecting holes during a programming operation near the virtual source, current may be read out at a drain of the memory cell transistor through a bit line BL1.

Embodiment 2

The vertically foldable memory array structure according to a second embodiment of the present disclosure comprises: a memory cell transistor set distributed in columns and rows and comprising a plurality of memory cell transistors, in which a gate of each memory cell transistor is connected to a word line; a plurality of drain selection transistors and a plurality of source selection transistors, in which each of the memory cell transistor sets in a $N^{th}$ column is connected to one drain selection transistor, and each of the memory cell transistor sets in a $(N+1)^{th}$ column is connected to one source selection transistor; and a plurality of bottom connecting lines connected between a memory cell transistor set in a $M^{th}$ row and in the $N^{th}$ column and a memory cell transistor set in a $(M+1)^{th}$ row and in the $(N+1)^{th}$ column, in which a drain of a drain selection transistor and a source of a source selection transistor corresponding to the memory cell transistor set in each row are connected to a same bit line, in which N and M are an integer.

Figure 12:
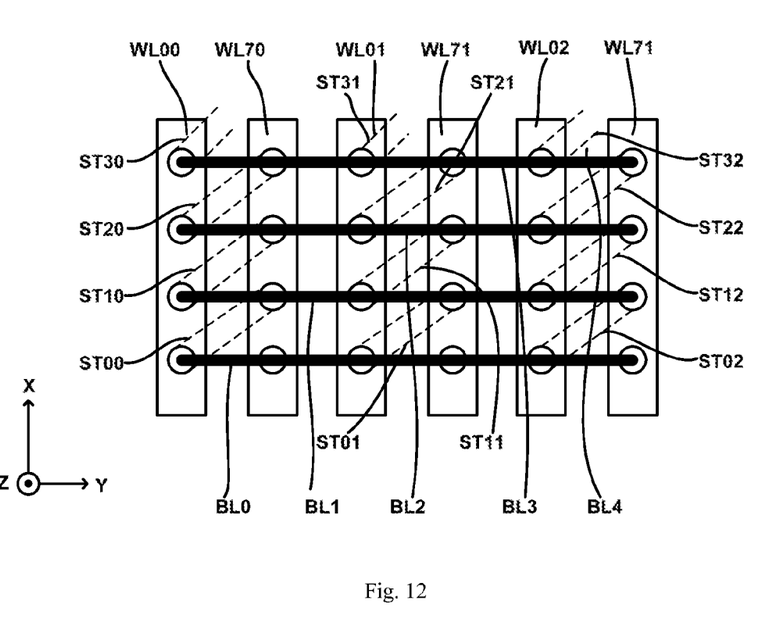
FIG. 12 is a top view of a vertically foldable memory array structure according to a second embodiment of the present disclosure.

FIG. 12 is a top view of a vertically foldable memory array structure according to a second embodiment of the present disclosure. In the first embodiment, a top bit line (BL) needs to be "distorted" to achieve connection of different bit lines at both ends of a memory string. However in the second embodiment, the bottom connecting lines instead of the top bit lines are "distorted" to achieve the connection of different bit lines at both ends of a memory string, as shown in a dashed line in FIG. 12. At the bottom of the whole memory array is a heavily doped connection layer, and a connection mode of the heavily doped connection layer is that (for simplicity of illustration, in the following, a 4×3×4 array is taken as an example, however, the present disclosure is not limited to this array): each branch comprising a drain selection transistor is connected to an adjacent branch comprising a source selection transistor in a subsequent row (with an X coordinate further from 0 point) in the same set (with the same Y coordinate) through the same bottom selection transistor to form an oblique series foldable "U"-shaped structure, as shown in a dashed line in FIG. 12. Disconnected regions are isolated with an insulating dielectric. The top bit line may be routed straightly. The bottom connecting line routing method described in the second embodiment differs from that in the first embodiment in a fabricating process, but a bit line multiplexing may also be achieved, which differs from a conventional NAND memory structure in which both a bit line and a source line (SL) must be needed to execute operations, thus reducing a space occupied by a routing, improving a density of the memory cell transistor and further reducing a process size. For simplicity of description, each operation method and principle in the second embodiment are the same as those in the first embodiment, so detailed description thereof will be omitted here.

According to an embodiment of the present disclosure, the vertically foldable memory array structure not only has simple structure, but also may be very suitable for a three-dimensional integration of the memory, thus greatly improving a high-density and large-capacity merit of the vertically foldable memory array structure. In addition, according to an embodiment of the present disclosure, a programming operation, an erasing operation and a reading operation are simple and flexible. Meanwhile, according to an embodiment of the present disclosure, a bit line is multiplexed to replace a source selection line (SL) in a conventional NAND memory, thus further simplifying a fabricating process, saving space, and further improving a memory efficiency and a memory capacity. Furthermore, in some embodiments of the present disclosure, all the transistors are vertical transistors with a longitudinal channel, thus causing a scaling down of a device to be more feasible, and meeting a requirement for further scaling down of a memory in future.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:
1. A vertically foldable memory array structure, comprising:
   a memory module distributed in columns and rows, the memory module comprising:
      a drain selection transistor;

a bottom connecting line and a source selection transistor; and a plurality of memory cell transistors connected between the drain selection transistor and the bottom connecting line and between the source selection transistor and the bottom connecting line, wherein a gate of each of the plurality of memory cell transistors is connected to a word line, a drain of each drain selection transistor is connected to a bit line, a drain of a drain selection transistor in a $M^{th}$ vertically foldable memory module in a $N^{th}$ column and a source of a source selection transistor in a $(M-1)^{th}$ memory module in a $(N+1)^{th}$ column are connected to a same bit line, gates of the drain selection transistors and the source selection transistors in all the memory modules in the $N^{th}$ column are connected to a same drain selection line and a same source selection line respectively, in which N and M are an integer.

2. The vertically foldable memory array structure according to claim 1, wherein the memory cell transistor comprises:
a tubular polysilicon body filled with an insulating dielectric; and
a tubular gate structure surrounding the tubular polysilicon body.

3. The vertically foldable memory array structure according to claim 2, wherein the tubular gate structure comprises a tubular tunneling oxide layer, a tubular silicon nitride layer, a tubular blocking oxide layer and a tubular gate layer sequentially surrounding the tubular polysilicon body.

4. The vertically foldable memory array structure according to claim 1, wherein the memory cell transistor is a charge trapping type memory or a nano-crystal memory.

5. The vertically foldable memory array structure according to claim 1, wherein if a programming voltage is applied to a word line of a selected memory cell transistor, a memory cell transistor between the selected memory cell transistor and the drain selection transistor is turned on, a memory cell transistor between the selected memory cell transistor and the source selection transistor is turned off, a programming voltage is applied to a bit line connected to a drain selection transistor which the selected memory cell transistor connects to, and a grounding voltage is applied to other bit lines, then a programming write operation is performed for the selected memory cell transistor.

6. The vertically foldable memory array structure according to claim 1, wherein if an erasing voltage is applied to a word line of one or more selected memory cell transistors, a grounding voltage is applied to a drain selection line of a drain selection transistor and a source selection line of a source selection transistor connected to the one or more selected memory cell transistors, and a grounding voltage is applied to all the bit lines, then an erasing operation is performed for the one or more selected memory cell transistors.

7. The vertically foldable memory array structure according to claim 1, wherein if a reading voltage is applied to a word line of a selected memory cell transistor, a reading passing voltage is applied to a drain selection line of a drain selection transistor and a source selection line of a source selection transistor connected to the selected memory cell transistor as well as an unselected word line, a reading voltage and a grounding voltage are applied to bit lines connected to a drain of the drain selection transistor and a source of the source selection transistor respectively, and other unselected bit lines are floated, then a reading operation is performed for the selected memory cell transistor.

8. The vertically foldable memory array structure according to claim 1, wherein a tubular channel region in the memory cell transistor is a polysilicon or germanium doped silicon semiconductor region.

9. A vertically foldable memory array structure, comprising:
a memory cell transistor set distributed in columns and rows and comprising a plurality of memory cell transistors, in which a gate of each memory cell transistor is connected to a word line;
a plurality of drain selection transistors and a plurality of source selection transistors, in which each of the memory cell transistor sets in a $N^{th}$ column is connected to one drain selection transistor, and each of the memory cell transistor sets in a $(N+1)^{th}$ column is connected to one source selection transistor; and
a plurality of bottom connecting lines connected between a memory cell transistor set in a $M^{th}$ row and in the $N^{th}$ column and a memory cell transistor set in a $(M+1)^{th}$ row and in the $(N+1)^{th}$ column,
wherein a drain of a drain selection transistor and a source of a source selection transistor corresponding to the memory cell transistor set in each row are connected to a same bit line, in which N and M are an integer.

10. The vertically foldable memory array structure according to claim 9, wherein the memory cell transistor comprises:
a tubular polysilicon body filled with an insulating dielectric; and
a tubular gate structure surrounding the tubular polysilicon body.

11. The vertically foldable memory array structure according to claim 10, wherein the tubular gate structure comprises a tubular tunneling oxide layer, a tubular silicon nitride layer, a tubular blocking oxide layer and the tubular gate layer sequentially surrounding the tubular polysilicon body.

12. The vertically foldable memory array structure according to claim 9, wherein the memory cell transistor is a charge trapping type memory or a nano-crystal memory.

13. The vertically foldable memory array structure according to claim 9, wherein a tubular channel region in the memory cell transistor is a polysilicon or germanium doped silicon semiconductor region.

\* \* \* \* \*